United States Patent
Koh et al.

(10) Patent No.: US 8,557,131 B2
(45) Date of Patent: Oct. 15, 2013

(54) METHODS OF FORMING FINE PATTERNS AND METHODS OF FABRICATING SEMICONDUCTOR DEVICES

(75) Inventors: Cha-won Koh, Yongin-si (KR); Min-joon Park, Yongin-si (KR); Chang-Min Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 100 days.

(21) Appl. No.: 13/286,640

(22) Filed: Nov. 1, 2011

(65) Prior Publication Data

US 2012/0115331 A1 May 10, 2012

(30) Foreign Application Priority Data

Nov. 4, 2010 (KR) .................. 10-2010-0109259

(51) Int. Cl.
*B44C 1/22* (2006.01)
*C03C 15/00* (2006.01)
*C03C 25/68* (2006.01)
*C23F 1/00* (2006.01)

(52) U.S. Cl.
USPC .................. 216/41; 216/47; 438/703

(58) Field of Classification Search
USPC .................. 216/41, 47; 438/703, 725
See application file for complete search history.

(56) References Cited

U.S. PATENT DOCUMENTS

| 2002/0039704 A1 | 4/2002 | Din et al. |
| 2008/0063985 A1* | 3/2008 | Jung et al. ................ 430/312 |

FOREIGN PATENT DOCUMENTS

| KR | 2008-0100688 A | 11/2008 |
| KR | 2009-0045754 A | 5/2009 |
| KR | 20100010777 A | 2/2010 |

* cited by examiner

*Primary Examiner* — Roberts Culbert
(74) *Attorney, Agent, or Firm* — Harness, Dickey & Pierce

(57) ABSTRACT

Method of forming fine patterns and methods of fabricating semiconductor devices by which a photoresist (PR) pattern may be transferred to a medium material layer with a small thickness and a high etch selectivity with respect to a hard mask to form a medium pattern and the hard mask may be formed using the medium pattern. According to the methods, the PR pattern may have a low aspect ratio so that a pattern can be transferred using a PR layer with a small thickness without collapsing the PR pattern.

20 Claims, 11 Drawing Sheets

METHODS OF FORMING FINE PATTERNS AND METHODS OF FABRICATING SEMICONDUCTOR DEVICES

CROSS-REFERENCE TO RELATED APPLICATION

This application claims priority under 35 U.S.C. §119 to Korean Patent Application No. 10-2010-0109259, filed on Nov. 4, 2010, in the Korean Intellectual Property Office (KIPO), the entire contents of which is incorporated herein by reference.

BACKGROUND

1. Field

Example embodiments of the inventive concepts relate to methods of forming fine patterns and methods of fabricating semiconductor devices, and more particularly, to methods of forming fine patterns and methods of fabricating semiconductor devices by which a pattern may be transferred using a photoresist (PR) layer of a small thickness without collapsing a PR pattern.

2. Description of the Related Art

With the miniaturization of electronic appliances, semiconductor devices have been downscaled. This may lead to downscaling of patterns used to form the semiconductor devices. Although research has been conducted with respect to methods of forming finer patterns to meet the requirements of downscaling patterns, problems still remain unresolved.

SUMMARY

Example embodiments of the inventive concepts may provide fine patterning methods using a thin photoresist (PR) pattern without collapsing the PR pattern. Example embodiments of the inventive concepts may provide methods of fabricating semiconductor devices by which a pattern may be transferred using a thin PR pattern without collapsing the PR pattern.

According to example embodiments of the inventive concepts, there is provided a method of forming a fine pattern. The method includes forming a first hard mask material layer on a semiconductor substrate, forming a medium material layer having a thickness of about 20 nm or less on the first hard mask material layer, forming a PR pattern on the medium material layer, forming a medium pattern by etching the medium material layer using the PR pattern as an etch mask, forming a first hard mask pattern by etching the first hard mask material layer using the medium pattern as an etch mask, and etching the semiconductor substrate using the first hard mask pattern as an etch mask.

The PR pattern may have an aspect ratio of 3 or less. The first hard mask material layer may include polysilicon (poly-Si), and the medium material layer may include silicon oxide. The first hard mask material layer may include a metal, a metal silicide, or a metal nitride, and the medium material layer may include silicon oxide or silicon oxynitride (SiON). In this case, the first hard mask material layer may include one material selected from the group consisting of tungsten (W), titanium (Ti), aluminum (Al), tungsten silicide ($WSi_x$), titanium nitride (TiN), tantalum nitride (TaN), tungsten nitride (WN), and a combination thereof.

The formation of the first hard mask material layer on the semiconductor substrate may include forming a second hard mask material layer having an etch selectivity with respect to the first hard mask material layer on the semiconductor substrate and forming the first hard mask material layer on the second hard mask material layer. The etching of the semiconductor substrate using the first hard mask pattern as an etch mask may include forming a second hard mask pattern by etching the second hard mask material layer using the first hard mask pattern as an etch mask and etching the semiconductor substrate using the second hard mask pattern as an etch mask. The second hard mask material layer may be a carbon (C)-based material layer. The second hard mask material layer may be a non-crystalline inorganic C-based material layer.

The formation of the first hard mask pattern by etching the first hard mask material layer using the medium pattern as an etch mask may include performing an isotropic etching process using an etching gas under an absolute pressure of about 5 mTorr to about 50 mTorr. The etching gas may include at least one selected from the group consisting of $Cl_2$, HBr, $SF_6$, $NF_3$, $BCl_3$, $O_2$, and $N_2$. The anisotropic etching process may be performed at a source power of about 10 W to about 1000 W and a bias power of about 500 W or less. During the forming of the first hard mask pattern by etching the first hard mask material layer using the medium pattern as an etch mask, a ratio of an etch rate of the first hard mask material layer to an etch rate of the medium pattern may be higher than 20.

The first hard mask material layer may include poly-Si. In this case, the formation of the medium material layer having the thickness of about 20 nm or less on the first hard mask material layer may include forming the medium material layer by thermally oxidizing the surface of the first hard mask material layer in an oxygen atmosphere. The formation of the PR pattern on the medium material layer may include forming a PR material layer on the medium material layer to a thickness of about 50 nm or less and exposing and developing the PR material layer. The medium pattern may have a height of about 5 nm to about 15 nm. The first hard mask material layer may have a thickness of about 50 nm to about 400 nm.

According to other example embodiments of the inventive concepts, there is provided a method of forming a fine pattern. The method includes forming a hard mask material layer on a semiconductor substrate, forming a medium material layer on the hard mask material layer, forming a PR pattern having an aspect ratio of about 3 or less on the medium material layer, forming a medium pattern by patterning the medium material layer using the PR pattern as an etch mask, forming a hard mask pattern by etching the hard mask material layer using the medium pattern as an etch mask, and etching the semiconductor substrate using the hard mask pattern as an etch mask. A thickness of the medium material layer is controlled such that the aspect ratio of the PR pattern remained after the medium pattern is formed by patterning the medium material layer is 0.3 or higher. During the forming of the hard mask pattern by etching the hard mask material layer using the medium pattern as an etch mask, a ratio of an etch rate of the hard mask material layer to an etch rate of the medium pattern may be higher than 20.

According to still other example embodiments of the inventive concepts, there is provided a method of fabricating a semiconductor device. The method includes providing a semiconductor substrate on which an etching target material layer is disposed, forming a hard mask material layer on the etching target material layer, forming a medium material layer on the hard mask material layer, forming a PR material layer on the medium material layer, forming a PR pattern by exposing an developing the PR material layer, forming a medium pattern by etching the medium material layer using the PR pattern as an etch mask, forming a hard mask pattern by etching the hard mask material layer using the medium pattern as an etch mask, and forming a pattern of the etching target material layer by etching the etching target material layer using the hard mask pattern as an etch mask. A thickness of the medium material layer is controlled such that the aspect ratio of the PR pattern remained after the medium pattern is formed by patterning the medium material layer is 0.3 or higher.

According to at least one example embodiment, a method of forming a fine pattern includes forming a first hard mask material layer on a substrate, forming a medium material layer to a thickness of less than or equal to about 20 nm on the first hard mask material layer, forming a photoresist (PR) pattern on the medium material layer, forming a medium pattern by removing a portion of the medium material layer using the PR pattern as a first mask, forming a first hard mask pattern by removing a portion of the first hard mask material layer using the medium pattern as a second mask, and removing a portion of the substrate.

According to at least one example embodiment, a method of forming a fine pattern includes forming a hard mask material layer on a substrate, forming a medium material layer on the hard mask material layer, forming a photoresist (PR) pattern with an aspect ratio of less than or equal to about 3 on the medium material layer, forming a medium pattern by patterning the medium material layer using the PR pattern as an etch mask, forming a hard mask pattern by etching the hard mask material layer using the medium pattern as an etch mask and etching the substrate using the hard mask pattern as an etch mask. A thickness of the medium material layer is determined such that the aspect ratio of the PR pattern remaining after the medium pattern is greater than or equal to about 0.3.

According to at least one example embodiment, a method of forming a fine pattern includes forming a first layer on a substrate layer, forming a second layer on the first layer, forming a photoresist (PR) mask on the second layer, forming a second layer mask exposing the first layer by removing a material of the second layer through the PR mask, forming a first layer mask exposing the substrate layer by removing a material of the first layer through the second layer mask, a removal rate of the material of the first layer being greater than a removal rate of a material of the second layer mask, and forming a substrate layer pattern by removing a material of the substrate layer through the first layer mask.

BRIEF DESCRIPTION OF THE DRAWINGS

Example embodiments will be more clearly understood from the following brief description taken in conjunction with the accompanying drawings. FIGS. 1A-6 represent non-limiting, example embodiments as described herein.

FIGS. 1A-2F are cross-sectional diagrams illustrating methods of forming fine patterns according to example embodiments of the inventive concepts;

FIG. 4 is a plan view illustrating memory modules including semiconductor devices fabricated according to example embodiments of the inventive concepts;

FIG. 5 is a block diagram illustrating memory cards including semiconductor devices fabricated according to example embodiments of the inventive concepts; and FIG. 6 is a block diagram illustrating systems including semiconductor devices fabricated according to example embodiments of the inventive concepts.

Figure 1A:
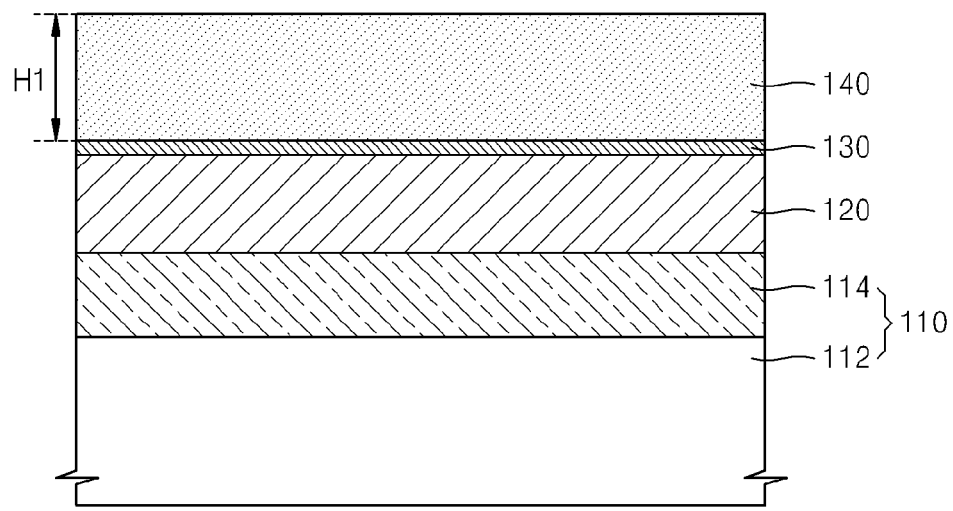

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A-2F are cross-sectional diagrams illustrating methods of forming fine patterns according to example embodiments of the inventive concepts. Referring to FIG. 1A, a first hard mask material layer 120 may be formed on a substrate 110. The substrate 110 may include a substrate upper layer 114 and a substrate lower layer 112. As used herein, one or both of the upper and lower substrate layers 114 and 112 may be part of a bulk substrate, or neither layer may be part of a bulk substrate. A substrate upper layer 114 may be an etch target material layer that is patterned using an etch process. The substrate lower layer 112 may be a layer that is not etched during the patterning of the substrate upper layer 114. The substrate upper layer 114 and the substrate lower layer 112 may include the same material or different materials.

When the substrate upper layer 114 and the substrate lower layer 112 include the same material, an interface between the substrate upper layer 114 and the substrate lower layer 112 may not exist. The substrate 110 may include a semiconductor material, for example, a Group IV semiconductor, a Group III-V compound semiconductor, and/or a Group II-VI oxide semiconductor. For example, the Group IV semiconductor may include silicon (Si), germanium (Ge), and/or SiGe. The substrate 110 may be, for example, a bulk wafer, and/or one or more epitaxial layers.

When the substrate upper layer 114 and the substrate lower layer 112 include different materials, the substrate lower layer 112 may include a semiconductor material, for example, a Group IV semiconductor, a Group III-V compound semiconductor, and/or a Group II-VI oxide semiconductor. The substrate 110 may include a bulk wafer and/or one or more epitaxial layers. The substrate upper layer 114 may be a stack structure that may be required to fabricate a subsequent semiconductor structure. For example, the substrate upper layer 114 may be a stack structure of tungsten (W) and silicon nitride to form a gate structure.

According to at least one example embodiment, the substrate upper layer 114 may be a metal layer and/or a doped poly-Si layer required for an interconnection. Configurations and combinations of the substrate upper and lower layers 114 and 112 may not be limited thereto and the substrate upper and lower layers 114 and 112 may be formed of arbitrary materials. For example, a semiconductor device, for example a transistor, may be previously formed in the substrate lower layer 112.

A medium material layer 130 may be formed on the first hard mask material layer 120. The first hard mask material layer 120 may be, for example, any material layer with high etch selectivity to the medium material layer 130. For example, the first hard mask material layer 120 may include poly-Si, a metal, a metal silicide and/or a metal nitride. For example, the metal may include titanium (Ti), tungsten (W), and/or aluminum (Al), although example embodiments of the inventive concepts are not limited thereto. The metal silicide may include, for example, tungsten silicide (WSix), and the metal nitride may include, for example, titanium nitride (TiN), tantalum nitride (TaN), and/or tungsten nitride (WN).

The first hard mask material layer 120 may be formed using, for example, a chemical vapor deposition (CVD) process, a physical vapor deposition (PVD) process, and/or an atomic layer deposition (ALD) process, although example embodiments of the inventive concepts are not limited thereto. A thickness of the first hard mask material layer 120 may be about 30 nm to about 600 nm, for example, about 50 nm to about 400 nm. However, a thickness of the first hard mask material layer 120 is not limited thereto. The medium material layer 130 may be any material layer with etch selectivity (e.g., high etch selectivity) to the first hard mask material layer 120. For example, the medium material layer 130 may include a silicon oxide (e.g., SiO2) and/or silicon oxynitride (SiON). A thickness of the medium material layer 130 may be about 3 nm to about 20 nm, for example, about 5 nm to about 15 nm, although example embodiments of the inventive concepts are not limited thereto. The medium material layer 130 may be formed using, for example, a CVD and/or an ALD process.

The medium material layer 130 and the first hard mask material layer 120 may be selectively etched with respect to each other. A ratio B/A of an etch rate B of the first hard mask material layer 120 to an etch rate A of the medium material layer 130 may be greater than 20. For example, the ratio B/A of the etch rates may be higher than 30. As another example, the ratio B/A of the etch rates may be higher than 50.

A combination of a material included in the first hard mask material layer 120 and a material included in the medium material layer 130 may be determined to obtain a relatively high ratio B/A of etch rates. For example, when the first hard mask material layer 120 includes W, the medium material layer 130 may include silicon oxide and/or silicon oxynitride.

As another example, when the first hard mask material layer 120 includes poly-Si, the medium material layer 130 may include silicon oxide. When the first hard mask material layer 120 includes poly-Si, the medium material layer 130 including silicon oxide may be formed by thermally oxidizing a top surface of the first hard mask material layer 120. The thickness of the first hard mask material layer 120 may be appropriately selected according to etch selectivity and/or a thickness of the medium material layer 130 and/or a height of a subsequent medium pattern (refer to 132a in FIG. 1C). For example, a thickness of the first hard mask material layer 120 may be about 30 nm to about 600 nm.

A photoresist (PR) material layer 140 may be formed on the medium material layer 130. The PR material layer 140 may include an ordinary PR composition. For example, the PR material layer 140 may be a positive type chemically-amplified PR composition containing a photo-acid generator (PAG). According to at least one example embodiment, the PR material layer 140 may be a resist composition for a KrF excimer laser (248 nm), a resist composition for an ArF excimer laser (193 nm) and/or a resist composition for an F2 excimer laser (157 nm).

A thickness of the PR material layer 140 may be determined in consideration of an aspect ratio of a desired PR pattern. A thickness of the PR material layer 140 may be, for example, about 60 nm or less. According to at least one example embodiment, a thickness of the PR material layer 140 may be, for example, about 40 nm or less. The PR material layer 140 with the above-described thickness may be formed using, for example, a spin coating process. A coated thickness of the PR material layer 140 may be controlled by adjusting the viscosity of the PR composition, a spin rate and/or a time of the spin coating process.

An anti-reflection layer (ARL) (not shown) may be formed between the medium material layer 130 and the PR material layer 140 as needed. The ARL may be formed of an organic and/or inorganic material. A lower material layer (not shown) that may be configured to prevent or reduce formation of an undercut and/or footing may be formed between the medium material layer 130 and the PR material layer 140. The lower material layer may be a known material, and a detailed description thereof will be omitted.

Figure 1B:
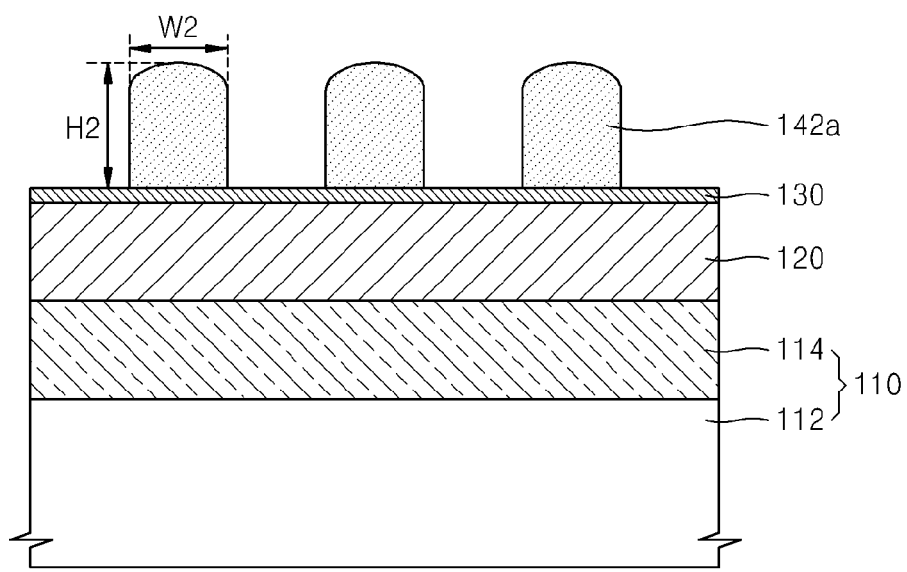

Referring to FIG. 1B, the PR material layer 140 may be exposed using a light source and an exposure mask. The PR material layer 140 may be developed to form a PR pattern 142a. An aspect ratio of the PR pattern 142a may be about 3 or less. According to at least one example embodiment, an aspect ratio of the PR pattern 142a may be about 2 or less. The aspect ratio may refer to a ratio (H2:W2) of a height H2 of the PR pattern 142a to a width W2 of the PR pattern 142a. Although FIG. 1B illustrates a case where the PR pattern 142a may be a line-and-space pattern, when the PR pattern 142a is a cylindrical shape, the aspect ratio may be a ratio of the height of the PR pattern 142a to a diameter thereof. When the aspect ratio is excessively high, the PR pattern 142a may collapse and preclude a subsequent process. The aspect ratio may be appropriately determined so as not to collapse the PR pattern 142a.

Referring to FIGS. 1A and 1B, a thickness H1 of the undeveloped PR material layer 140 may not be necessarily equal to a thickness or height H2 of the developed PR pattern 142a. The thickness or height H2 of the developed PR pattern 142a may be less than the thickness H1 of the PR material layer 140. This may result from the loss of a region of the PR pattern 142a during a developing process. The thickness H1 of the PR material layer 140 may be determined in consideration of the desired aspect ratio and the loss of the region of the PR pattern 142a. For example, the height H2 of the PR pattern 142a may be about 55 nm or less. According to at least one example embodiment, the height H2 of the PR pattern 142a may be, for example, about 35 nm or less.

Figure 1C:
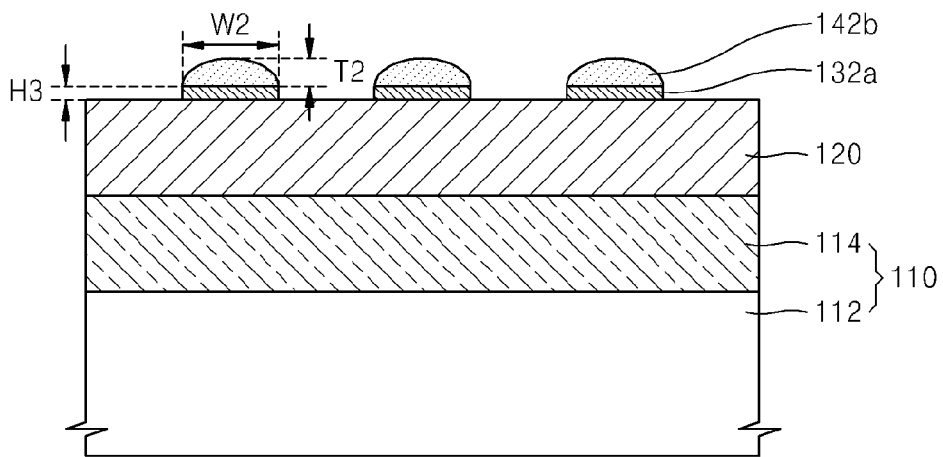

Referring to FIG. 1C, the medium material layer 130 may be anisotropically etched using the PR pattern 142a as an etch mask, thereby forming a medium pattern 132a and a PR pattern 142b. Due to the anisotropic etch process, the height of the PR pattern 142b may become much less than the initial height H2. If a partial region of the PR pattern 142b is removed before the medium pattern 132a is formed, because a top surface of the medium pattern 132a may be continuously exposed to an etchant from a time point when the PR pattern 142b is completely removed to a time point when the medium pattern 132a is completely formed, a damaged medium pattern may result. An etch recipe may be appropriately determined such that any partial region of the PR pattern 142b may not be removed before the medium pattern 132a is completely formed.

According to at least one example embodiment, a thickness of the medium material layer 130 may be determined such that an aspect ratio of the PR pattern 142b that remains after the medium pattern 132a is formed by patterning the medium material layer 130 may be about 0.3 or higher. When the medium material layer 130 is excessively thick, an aspect ratio of the PR pattern 142b that may remain after the medium pattern 132a is formed may be less than 0.3, and a portion of the PR pattern 142b may not remain.

When the medium pattern 132a is formed, the remaining PR pattern 142b may include a curved top surface as shown in FIG. 1C. A height T2 of a highest portion of the remaining PR pattern 142b including the curved top surface may be used to define the aspect ratio. The aspect ratio of the PR pattern 142b of FIG. 1C may be defined as T2:W2. The medium pattern 132a may be the same thickness as the medium material layer 130. A thickness of the medium pattern 132a may be about 3 nm to about 20 nm, for example, a thickness of about 5 nm to about 15 nm. However, the thickness of the medium pattern 132a may not be limited thereto.

Figure 1D:
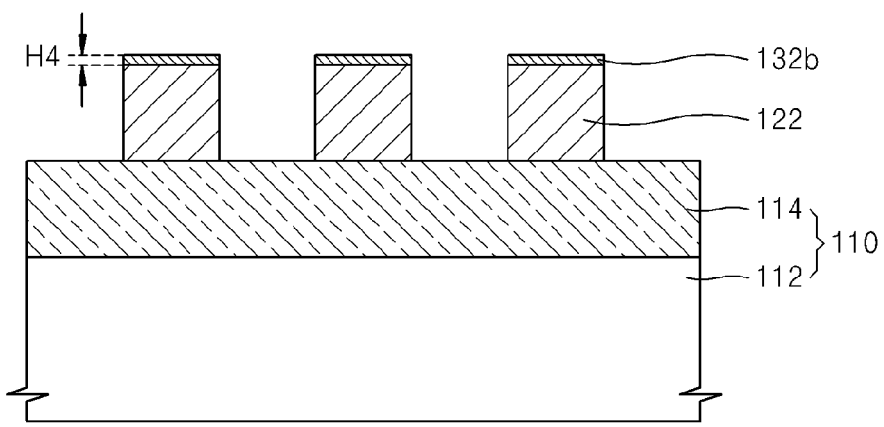

Referring to FIG. 1D, the first hard mask material layer 120 may be, for example, anisotropically etched using the medium pattern 132a as an etch mask, thereby forming a first hard mask 122 and a medium pattern 132b. An etch selectivity of a material included in the medium pattern 132a to a material included in the first hard mask material layer 120 may be high. A ratio B/A of an etch rate B of the first hard mask material layer 120 to an etch rate A of the medium pattern 132a may be greater than about 20. For example, the ratio B/A of the etch rates may be greater than about 30. According to at least one example embodiment, the ratio B/A of the etch rates may be greater than 50. Referring to FIGS. 1C and 1D, a thickness H4 of the medium pattern 132b of FIG. 1D may become less than a thickness H3 of the medium pattern 132a of FIG. 1C. This is because an upper portion of the medium pattern 132a may be partially etched due to anisotropic etching.

In view of a relationship between the PR pattern 142a of FIG. 1B and the medium pattern 132a of FIG. 1C, any PR pattern 142a may not be removed until the medium pattern 132a is completely formed. In view of a relationship between the medium pattern 132a of FIG. 1C and the first hard mask 122 of FIG. 1D, any partial region of the medium pattern 132a may not be removed until the first hard mask 122 is completely formed. The medium pattern 132b may need to remain on the entire region until the first hard mask 122 is completely formed, and may protect the first hard mask 122 that is disposed under the medium pattern 132b. Although a ratio of the thickness of the first hard mask material layer 120 to the thickness H3 of the medium pattern 132a may be considered, a high etch selectivity between the medium pattern 132a and the first hard mask material layer 120 may be required.

To obtain a high etch selectivity, a material included in the first hard mask material layer 120 and a material included in the medium pattern 132a may be appropriately selected. To obtain the high etch selectivity, etch conditions may be appropriately selected. An appropriate selection of both high etch selectivity and etch conditions may be required. This is because etch selectivity may vary according to the kind of etchant, an etch pressure, and/or etch energy, for example. To obtain a high etch selectivity, the etchant may be, for example, Cl2, HBr, SF6, NF3, BCl3, O2 and/or N2.

A reaction chamber where the first hard mask material layer 120 is etched may be maintained under an internal absolute pressure of about 3 mTorr to about 100 mTorr, for example, an absolute pressure of about 5 mTorr to about 50 mTorr. The reaction chamber may be maintained under an internal absolute pressure of, for example, about 10 mTorr to about 35 mTorr. A source power of, for example, about 100 W to about 1000 W and a bias power of, for example, about 500 W or less may be applied to the reaction chamber where the first hard mask material layer 120 is etched. According to at least one example embodiment, a source power of about 200 W to about 700 W and a bias power of about 50 W to about 300 W may be applied to the reaction chamber.

Figure 1E:
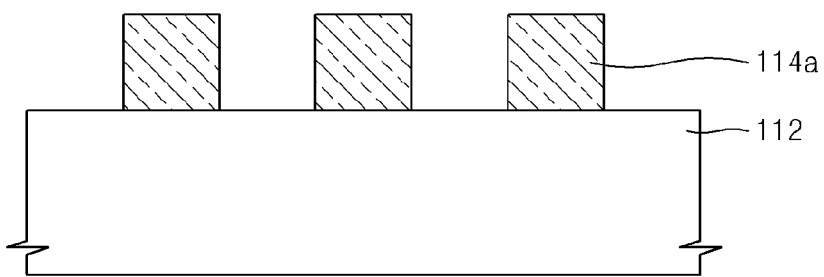

Referring to FIG. 1E, the substrate upper layer 114 may be anisotropically etched using the first hard mask 122 as an etch mask, thereby forming a target pattern 114a. The target pattern 114a may be, but not limited to, a gate structure and/or an interconnection configured to supply power and/or transmit signals. Although it is described herein that one hard mask (e.g., the first hard mask 122) used to etch the substrate 110 is directly on the substrate 110, two or more hard masks may be formed to etch the substrate 110 as needed. According to example embodiments, a number of the hard masks is not limited.

Figure 2A:
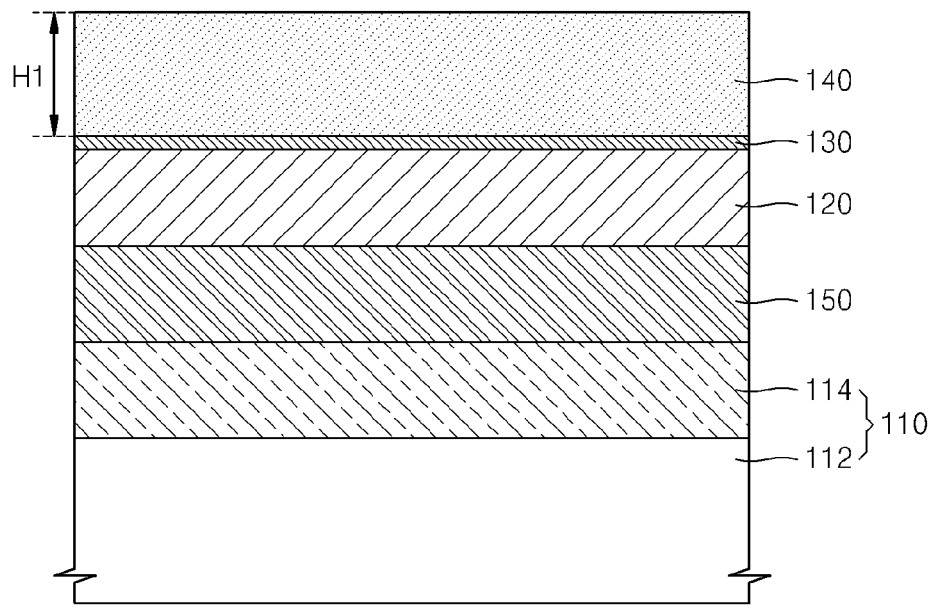

Referring to FIG. 2A, a second hard mask material layer 150 may be formed on the substrate 110 including the upper layer 114 and the lower layer 112, and a first hard mask material layer 120 may be formed on the second hard mask material layer 150. Here, it may be assumed that the substrate upper layer 114 is an etch target material layer. Because the substrate 110, the first hard mask material layer 120, the medium material layer 130, and the PR material layer 140 of FIG. 2A may be the same or similar to the substrate 110, the first hard mask material layer 120, the medium material layer 130, and the PR material layer 140 described with respect to FIGS. 1A-1E, a detailed description thereof may be omitted.

The second hard mask material layer 150 may be, for example, a carbon (C)-based material layer (e.g., an amorphous carbon layer (ACL) and/or a spin-on hardmask (SOH)). For example, to form the second hard mask material layer 150, an organic compound may be spin-coated to a thickness of about 1000 Å to about 5000 Å to form an organic compound layer. The organic compound may include, for example, a hydrocarbon compound including aromatic rings (e.g., phenyl, benzene, and/or naphthalene and/or derivatives thereof). Carbon may be contained at a relatively high content of about 85-99% by weight, based on the total weight of the organic compound. The organic compound layer may be primarily baked at a temperature of about 150° C. to about 350° C. to form a C-containing layer. The primary bake process may be, for example, performed for about 60 seconds. The C-containing layer may be cured by a secondary bake process at a temperature of about 300° C. to about 550° C. The secondary bake process may be, for example, performed for about 30 seconds to about 300 seconds.

Figure 2B:
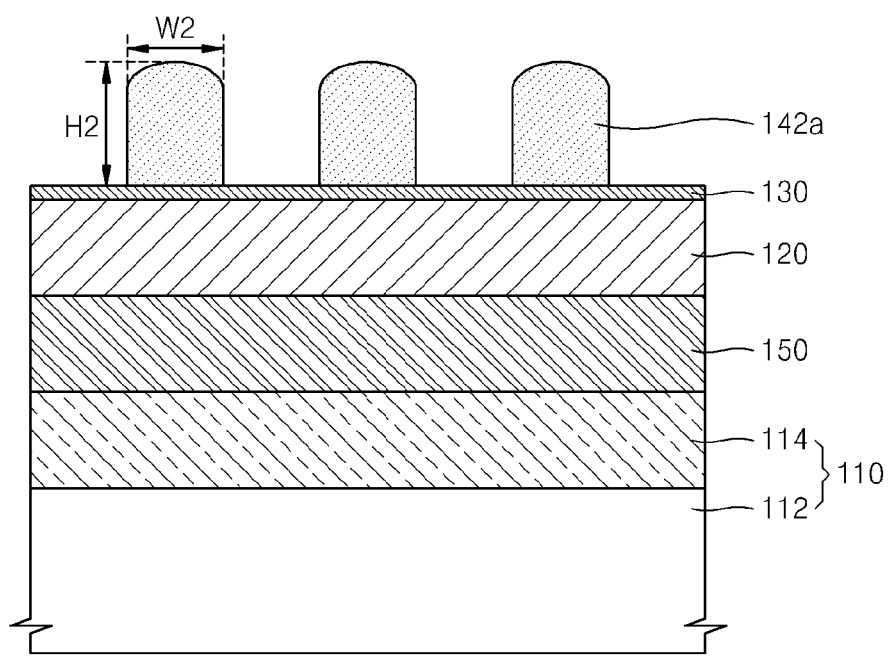

Referring to FIG. 2B, a PR pattern 142a may be formed in the same or similar manner to example embodiments described with reference to FIG. 1B. An aspect ratio of the PR pattern 142a may be about 3 or less, for example, an aspect ratio of about 2 or less. When the aspect ratio is great (e.g., excessively high), the PR pattern 142a may collapse to preclude a subsequent process. Due to loss caused by the formation of the PR pattern 142a, the height H2 of the PR pattern 142a may be lower than the height H1 of the PR material layer 140.

Figure 2C:
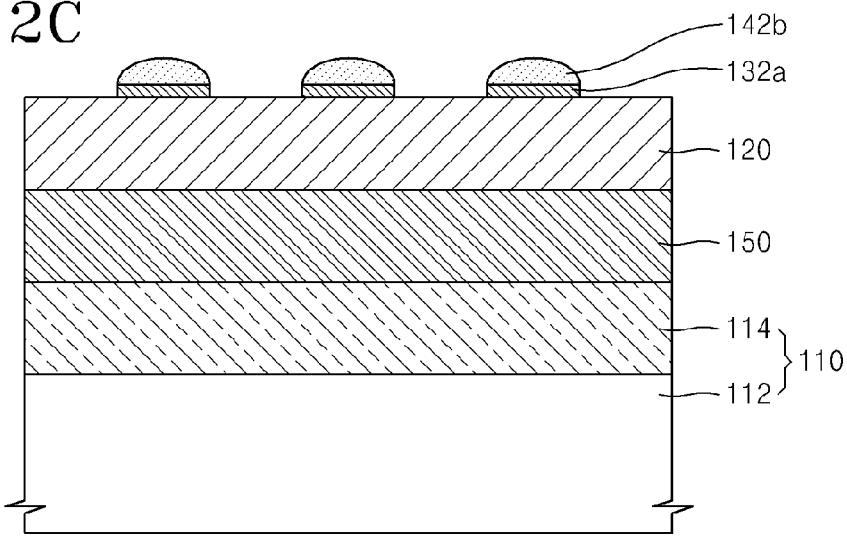

Referring to FIG. 2C, the medium material layer 130 may be anisotropically etched using the PR pattern 142a as an etch mask. A height of the PR pattern 142b after the anisotropic etching of the medium material layer 130 may be less than the height H2 of the PR pattern 142a. A thickness of the medium pattern 132a may be about 3 nm to about 20 nm, for example, about 5 nm to about 15 nm. However, the thickness of the medium pattern 132a is not limited thereto. As described with reference to FIG. 1C, the thickness of the medium material layer 130 may be determined such that an aspect ratio of the PR pattern 142b remaining after the medium pattern 132a is formed by patterning the medium material layer 130 may be about 0.3 or greater.

Figure 2D:
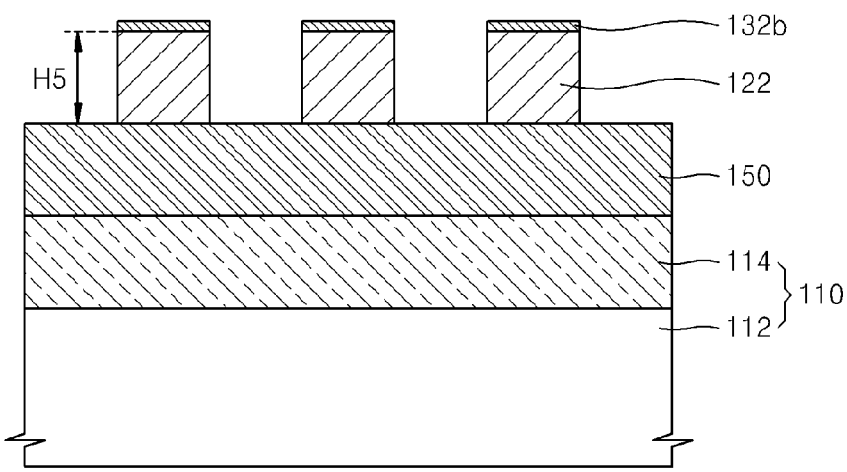

Referring to FIG. 2D, the first hard mask material layer 120 may be anisotropically etched using the medium pattern 132a as an etch mask, thereby forming a first hard mask 122 and a medium pattern 132b. In this case, as described above, an etch selectivity of the medium pattern 132a to the first hard mask material layer 120 may be high. A ratio B/A of an etch rate B of the first hard mask material layer 120 to an etch rate A of the medium pattern 132a may be greater than about 20. For example, the ratio B/A of the etch rates may be greater than about 30. According to at least one example embodiment, the ratio B/A of the etch rates may be greater than about 50. Because etching conditions for ensuring the above-described high etch selectivity are discussed above with reference to FIG. 1D, a detailed description thereof may be omitted here.

Figure 2E:
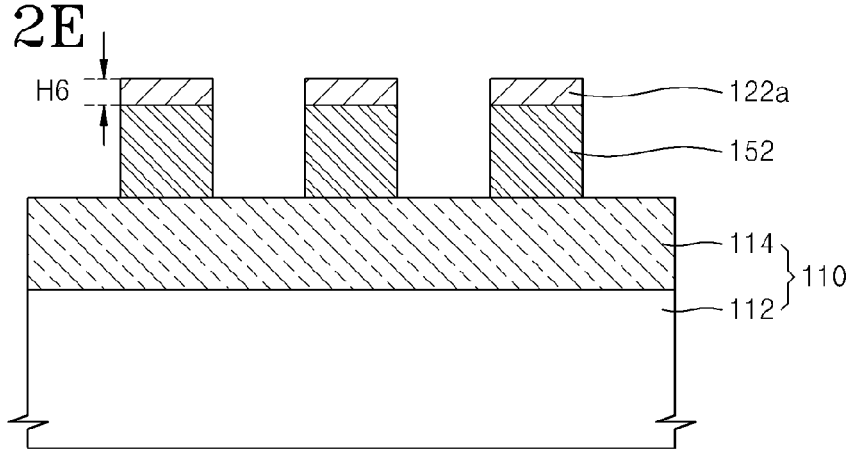

Referring to FIG. 2E, the second hard mask material layer 150 may be anisotropically etched using the first hard mask 122 as an etch mask, thereby forming a second hard mask 152 and a first hard mask 122a. As a result of the anisotropic etching of the second hard mask material layer 150 to obtain the second hard mask 152, a height H6 of the first hard mask 122a may be much less than the height (refer to H5 in FIG. 2D) of the first hard mask 122.

When even a partial region of the first hard mask 122 is removed before the second hard mask 152 is completely formed, because a top surface of the second hard mask 152 may be continuously exposed to an etchant from a time point when the first hard mask 122a is completely removed to a time point when the second hard mask 152 is completely formed, a damaged second hard mask 152 may be obtained. An etch recipe may be appropriately determined such that any partial region of the first hard mask 122a may not be removed before the second hard mask 152 is completely formed.

Figure 2F:
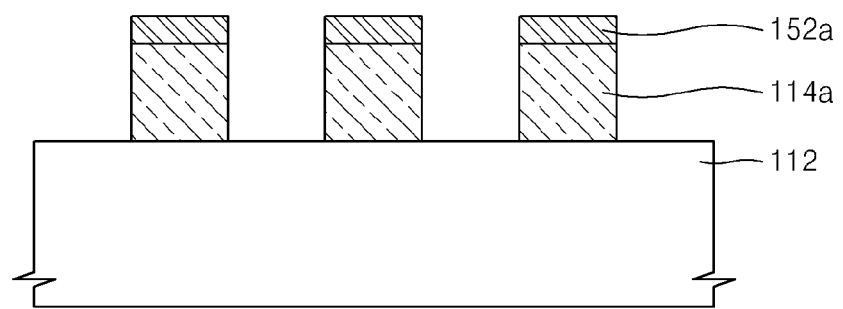

Referring to FIG. 2F, the substrate upper layer 114 may be anisotropically etched using the second hard mask 152 as an etch mask, thereby forming a target pattern 114a and a second hard mask 152a. The target pattern 114a may be, but not limited to, a gate structure and/or an interconnection configured to supply power and/or transmit signals. After the target pattern 114a is formed, the second hard mask 152a may be removed from the target pattern 114a. Because the second hard mask 152a may include a C-based material, the second hard mask 152a may be easily removed using, for example, an ash process.

Figure 3A:
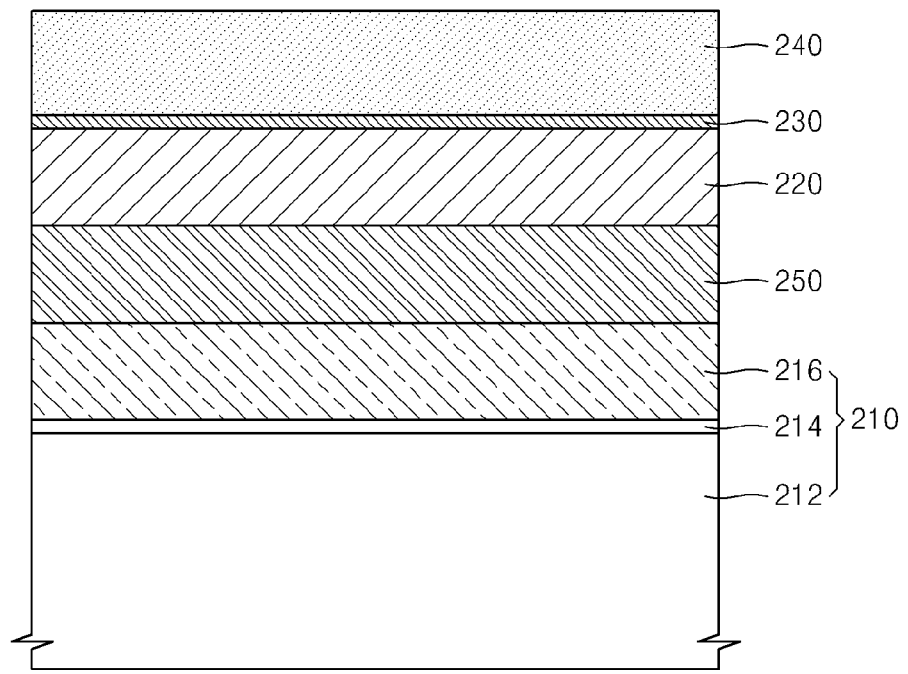
FIGS. 3A-3M are cross-sectional diagrams illustrating methods of fabricating semiconductor devices according to other example embodiments of the inventive concepts.

FIGS. 3A-3M are cross-sectional diagrams illustrating methods of fabricating semiconductor devices according to other example embodiments of the inventive concepts. Referring to FIG. 3A, a substrate layer 210 may include a substrate lower layer 212, a pad oxide layer 214 formed on the substrate lower layer 212, and a substrate upper layer 216 stacked on the pad oxide layer 214. Although the substrate lower layer 212 may be a silicon single crystalline substrate, the inventive concept may not be limited thereto and the substrate lower layer 212 may include, for example, a silicon-on-insulator (SOI) substrate, a compound substrate, and/or an oxide semiconductor substrate. Here, it may be assumed that an upper portion of the substrate lower layer 212 may be an etch target material layer. The pad oxide layer 214 may be formed using, for example, a thermal oxidation process, a CVD process, and/or an ALD process.

The substrate upper layer 216 may include, for example, silicon nitride. However, example embodiments of the inventive concepts may not be limited thereto and the substrate upper layer 216 may include, for example, any material with a sufficiently high etch selectivity with respect to a hard mask formed on the substrate upper layer 216. The substrate upper layer 216 including silicon nitride may be formed using, for example, SiH2Cl2 gas, SiH4 gas and/or NH3 gas, using a low-pressure CVD (LPCVD) process and/or a plasma-enhanced CVD (PECVD) process. However, example embodiments of the inventive concepts are not limited thereto and the substrate upper layer 216 including silicon nitride may be formed using any known method.

A second hard mask material layer 250, a first hard mask material layer 220, a medium material layer 230 and a PR material layer 240 may be stacked (e.g., sequentially stacked) on the substrate upper layer 216. Because materials forming the second hard mask material layer 250, the first hard mask material layer 220, the medium material layer 230, and the PR material layer 250 may be the same or similar to materials described above with reference to FIGS. 1A and 2A, a detailed description thereof may be omitted.

Figure 3B:
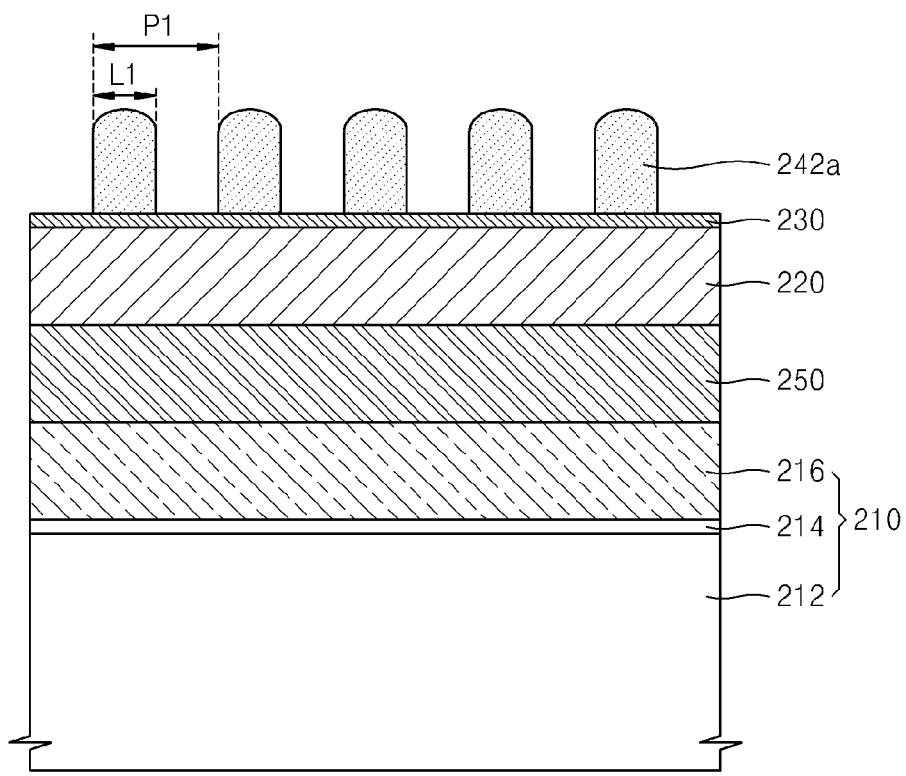

Referring to FIG. 3B, the PR material layer 240 may be exposed using a light source and an exposure mask, and developed to form a PR pattern 242a. An aspect ratio of the PR pattern 242a may be about 3 or less, for example, about 2 or less. Because an aspect ratio of the PR pattern 242a may be about 3 or less, for example, an aspect ratio of about 2 or less, the PR pattern 242a with a relatively small and/or reduced line width may be formed without distortion. For example, a pitch P1 of the line-and-space pattern shown in FIG. 3B may be about 100 nm or less. In this case, a line width L1 of lines of the line-and-space pattern may be about 50 nm or less. According to at least one example embodiment, a pitch P1 of the line-and-space-pattern may be, for example, about 80 nm or less. In this case, a line width L1 of the lines of the line-and-space-pattern may be about 40 nm or less. According to at least one example embodiment, a pitch P1 of the line-and-space pattern may be, for example, about 60 nm or less. In this case, a line width L1 of the lines of the line-and-space pattern may be about 30 nm or less. The foregoing pitches and line widths are provided as examples and example embodiments are not limited thereto.

Figure 3C:
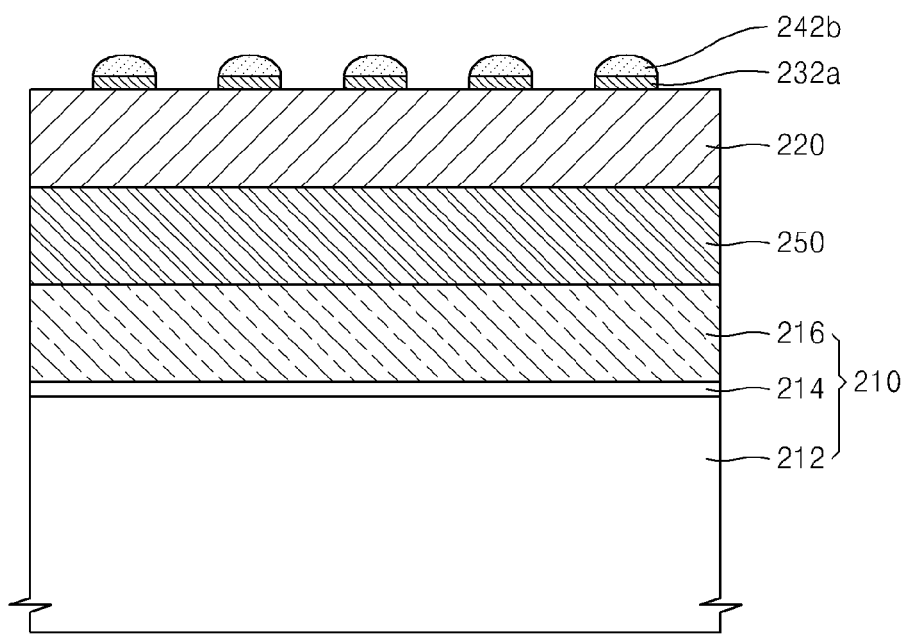

Referring to FIG. 3C, the medium material layer 230 may be, for example, anisotropically etched using the PR pattern 242a as an etch mask, thereby forming a medium pattern 232a and a PR pattern 242b. In this case, due to the anisotropic etch, a height of the PR pattern 242b may be less than the height of the PR pattern 242a as shown in FIG. 3B. A thickness of the medium pattern 232a may be about 3 nm to about 20 nm, for example, about 5 nm to about 15 nm, although example embodiments of the inventive concepts are not limited thereto.

Figure 3D:
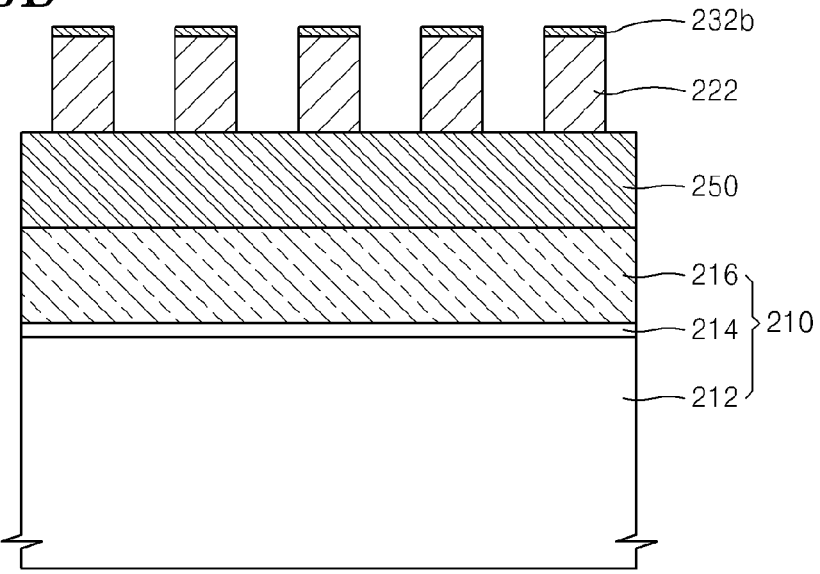

Referring to FIG. 3D, the first hard mask material layer 220 may be, for example, anisotropically etched using the medium pattern 232a as an etch mask, thereby forming a first hard mask 222 and a medium pattern 232b. In this case, an etch selectivity of the medium pattern 232a to the first hard mask material layer 220 may be high. A ratio B/A of an etch rate B of the first hard mask material layer 220 to an etch rate A of the medium pattern 232a may be greater than about 20. For example, the ratio B/A of the etch rates may be greater than about 30. According to at least one example embodiment, the ratio B/A of the etch rates may be greater than about 50. Because etch conditions for obtaining high etch selectivity are discussed above with reference to FIG. 1D, a detailed description thereof may be omitted.

Figure 3E:
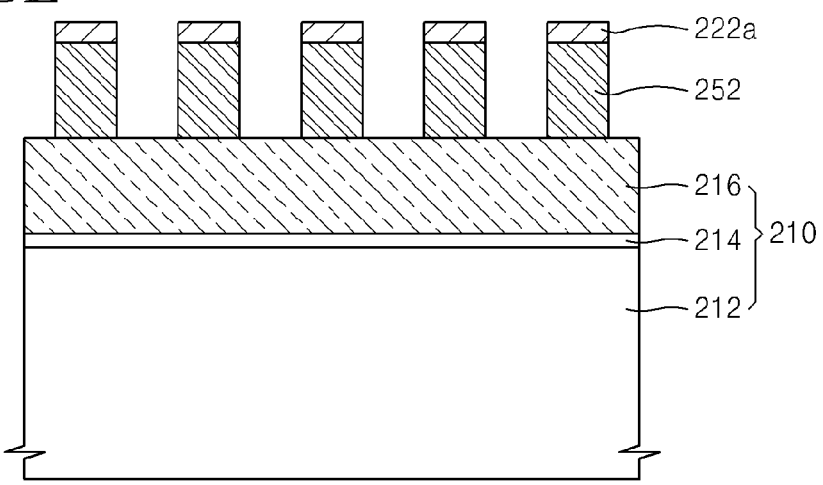

Referring to FIG. 3E, the second hard mask material layer 250 may be, for example, anisotropically etched using the first hard mask 222 as an etch mask, thereby forming a second hard mask 252 and a first hard mask 222a. As a result of an anisotropic etch of the second hard mask material layer 250 to obtain the second hard mask 252, a height of the first hard mask 222a may be much less than a height of the first hard mask 222 (refer to FIG. 3D).

Figure 3F:
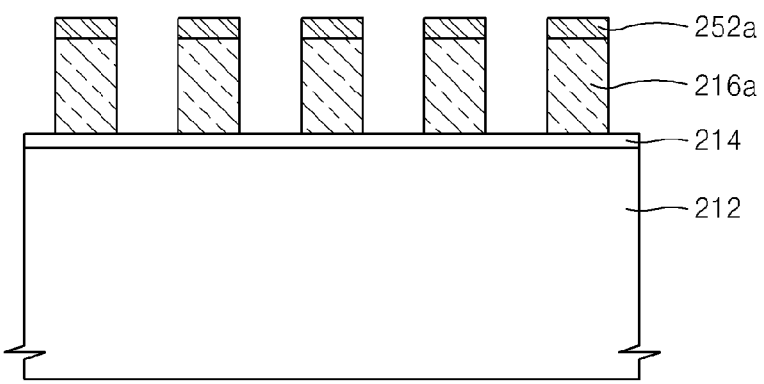

Referring to FIG. 3F, the substrate upper layer 216 may be, for example, anisotropically etched using the second hard mask 252 as an etch mask. Because a structure obtained by anisotropically etching the substrate upper layer 216 may serve as a hard mask when etching the substrate lower layer 212 and the pad oxide layer 214, the structure may be referred to as a third hard mask 216a. After anisotropically etching the substrate upper layer 216, the second hard mask 252 may partially remain on the third hard mask 216a as a second hard mask 252a. Because the second hard mask 252 may include a C-based material, the second hard mask 252a may be easily removed using an ash process.

Figure 3G:
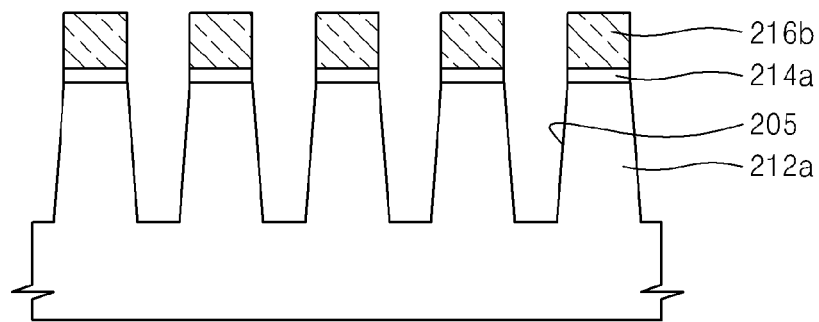

Referring to FIG. 3G, the pad oxide layer 214 and the substrate lower layer 212 may be, for example, anisotropically etched using the third hard mask 216a as an etch mask, thereby forming a third hard mask 216b, a pad oxide pattern 214a, active regions 212a and trenches 205 across the substrate lower layer 212. A thickness of the trenches 205 may be about 100 nm to about 500 nm. Active regions 212a may be defined by the trenches 205. Selectively, during the etch process for forming the trenches 205, an oxidation process may be performed on the lateral surfaces exposed inside the trenches 205 to cure Si damage that may be caused by high-energy ion bombardment and that may prevent generation of a leakage current. Due to the oxidation process, an oxide layer (not shown) with a thickness of about 3 nm may be formed on the inner lateral surfaces of the trenches 205.

Figure 3H:
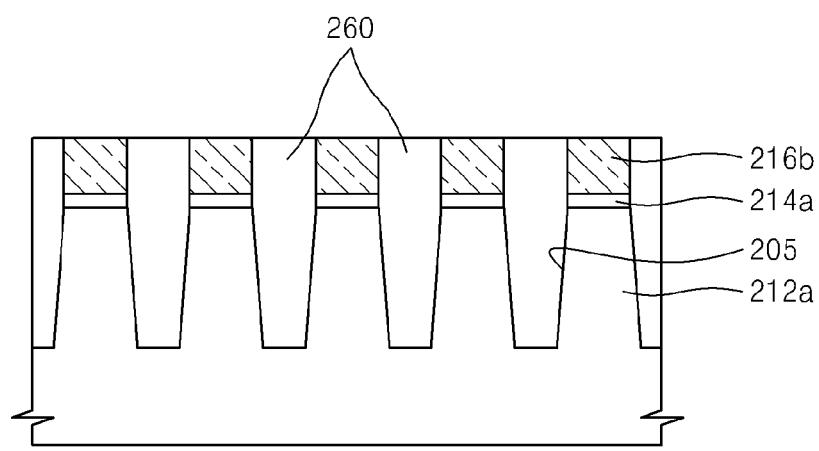

Referring to FIG. 3H, a field insulating layer (not shown) may be formed on the substrate lower layer 212 that may include the trenches 205 to fill the trenches 205. The field insulating layer may be, for example, a silicon oxide layer. The silicon oxide layer may be, for example, an undoped silica glass (USG) layer, an O3-tetraethyl orthosilicate (TEOS) USG layer, and/or a high-density plasma (HDP) oxide layer formed using SiH4, O2, and/or Ar gases as plasma sources, although example embodiments of the inventive concepts are not limited thereto. An upper portion of the field oxide layer may be removed, for example, using a planarization process (e.g., a chemical mechanical polishing (CMP)

process) thereby forming isolation layers 260 that may isolate the active regions 212a from one another.

Figure 3I:
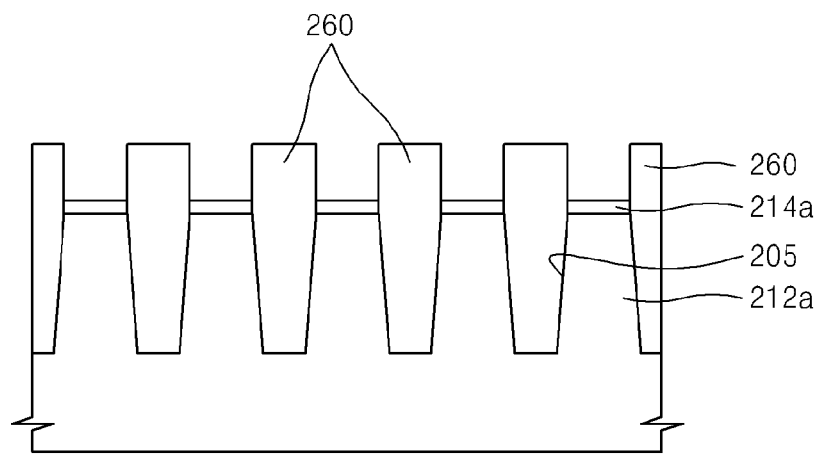

Referring to FIG. 3I, the third hard mask 216b may be removed using, for example, a wet etch process. The wet etch process may be performed using, for example, an etchant containing phosphoric acid. According to at least one example embodiment, when the pad oxide layer 214a cannot function as a tunnel oxide layer due to the thickness and quality thereof, the pad oxide layer 214a may be removed along with the third hard mask 216b, and a tunnel oxide layer (not shown) may be formed in a region from which the pad oxide layer 214a is removed. The tunnel oxide layer may be formed using, for example, a thermal oxidation process and/or a CVD process.

Figure 3J:
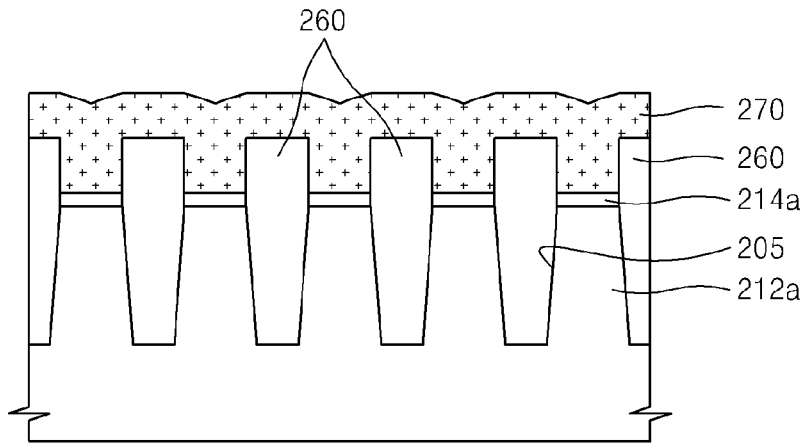

Referring to FIG. 3J, a poly-Si layer 270 may be formed on the pad oxide layer 214a and the isolation layer 260 to fill (e.g., sufficiently fill) a space from which the third hard mask 216b is removed. The poly-Si layer 270 may include, for example, doped poly-Si. The doped poly-Si may be formed using, for example, an LPCVD process and/or an impurity doping process. For example, an impurity doping process may be performed in-situ during formation of the poly-Si layer 270 using an LPCVD process. According to at least one example embodiment, the poly-Si layer 270 may be formed using an LPCVD process and then doped with impurities.

Figure 3K:
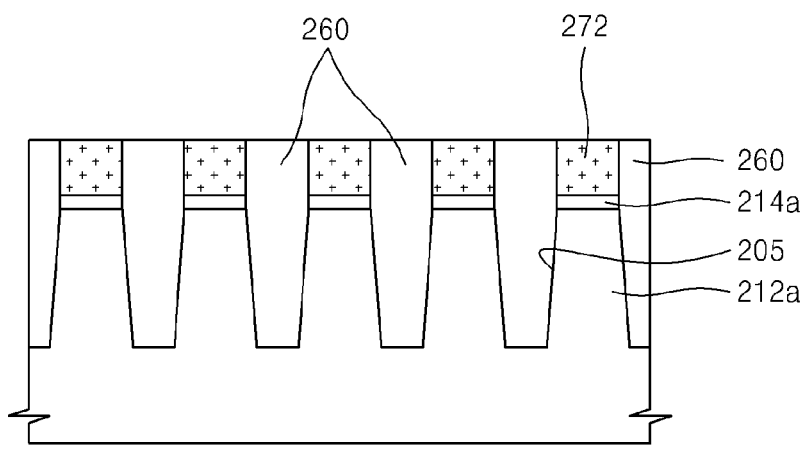
Figure 3L:
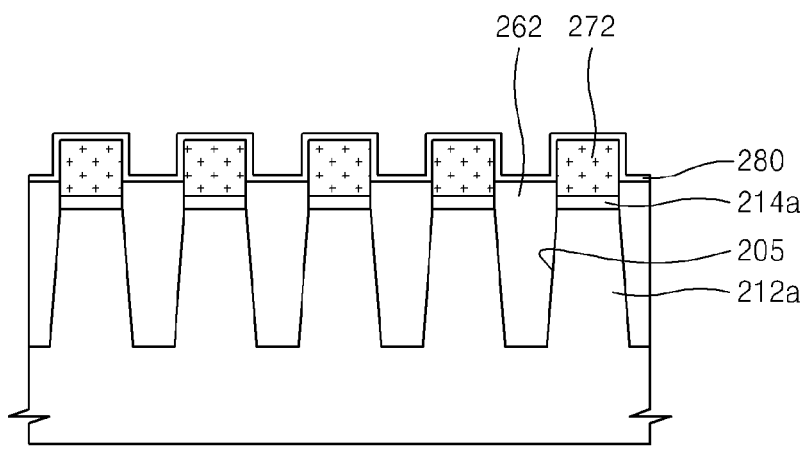

Referring to FIG. 3K, an upper portion of the poly-Si layer 270 may be removed using, for example, a planarization process (e.g., a CMP process) thereby forming floating gates 272 on the pad oxide layer 214a. The CMP process may be performed until a top surface of the isolation layer 260 is exposed. Referring to FIG. 3L, an upper portion of the isolation layer 260 may be partially removed using, for example, an isotropic and/or anisotropic etch process. According to at least one example embodiment, to obtain good and/or improved device characteristics, the upper portion of the isolation layer 260 may be removed form an isolation layer 262 so as not to expose the pad oxide layer 214a. This is because when the isolation layer 260 is removed to expose the pad oxide layer 214a, the pad oxide layer 214a may be damaged by an etchant.

A dielectric layer 280 may be formed on the floating gates 272 and the isolation layer 262. The dielectric layer 280 may be, for example, a high-k dielectric layer formed of a high-k dielectric material and/or a composite dielectric layer (e.g., an ONO layer) that may be obtained by sequentially stacking oxide, nitride, and oxide. The high-k dielectric layer may include $Y_2O_3$, $HfO_2$, $ZrO_2$, $Nb_2O_5$, $BaTiO_3$, and/or $SrTiO_3$, and may be formed using, for example, an ALD and/or CVD process. A composite dielectric layer may be formed using, for example, an LPCVD process.

Figure 3M:
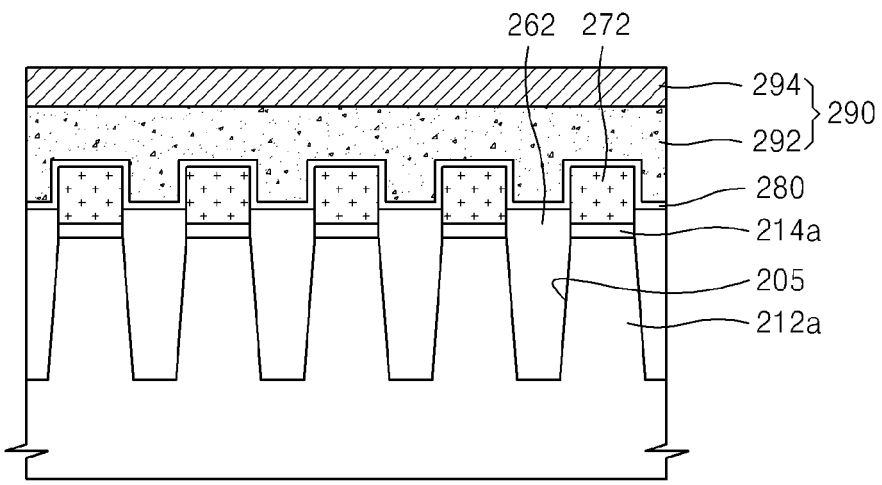

Referring to FIG. 3M, control gates 290 may be formed on the dielectric layer 280. The control gates 290 may include a first conductive layer 292 and/or a second conductive layer 294, and may extend in a direction across the active regions 212a. The first conductive layer 292 may be, for example, doped poly-Si. The second conductive layer 294 may be, for example, a metal silicide (e.g., tungsten silicide ($WSi_x$), titanium nitride ($TiSi_x$), cobalt silicide ($CoSi_x$) and/or tantalum silicide ($TaSi_x$)).

The formation of the control gates 290 may include sequentially stacking a material layer that may form the first conductive layer 292 and a material layer that may form the second conductive layer 294 on the entire surface of a substrate and patterning the material layers using, for example, a method described with reference to FIGS. 1A-1E and/or FIGS. 2A-2F. The material layer forming the first conductive layer 292, the material layer forming the second conductive layer 294, the dielectric layer 280, the floating gates 272, and the pad oxide layer 214a may be sequentially patterned using, for example, a method described with reference to FIGS. 1A-1E and/or FIGS. 2A-2F. A gate structure of, for example, a flash memory device may be formed. Although not shown, source and drain regions may be formed using an impurity doping process in the surfaces of the active regions 212a disposed opposite to each other with respect to the gate structure.

A semiconductor device may be fabricated using a method according to example embodiments of the inventive concepts. Although the above-described embodiments describe that active regions are defined, and/or word lines and/or gate structures are formed using a method described with reference to FIGS. 1A-1E and/or a method described with reference to FIGS. 2A-2F, it will be understood by those skilled in the art in possession of example embodiments that fine patterns configured to form bit lines and/or other fine structures may be formed using the methods according to example embodiments of the inventive concepts.

Figure 4:
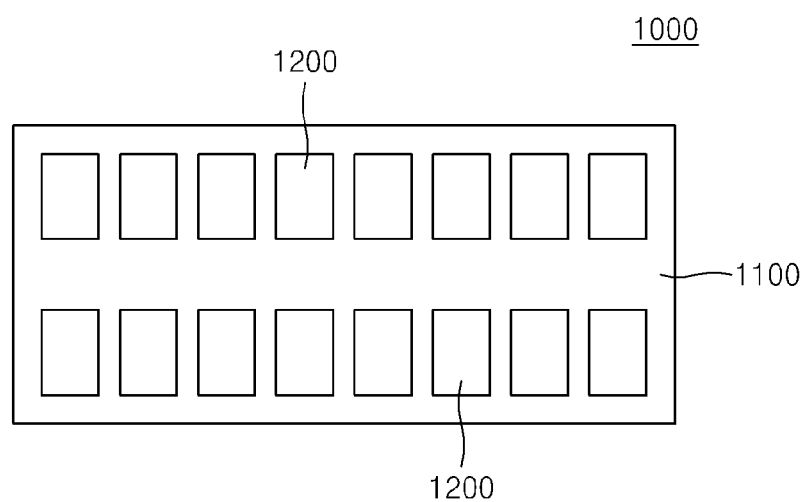

FIG. 4 is a plan view illustrating memory modules including semiconductor devices fabricated according to example embodiments of the inventive concepts. Referring to FIG. 4, a memory module 1000 may include a printed circuit board (PCB) 1100 and a plurality of semiconductor packages 1200. Each of the plurality of semiconductor packages 1200 may include at least one of the semiconductor devices fabricated according to the example embodiments of the inventive concepts. Each of the plurality of semiconductor packages 1200 may include at least one semiconductor device fabricated using at least a portion of the methods of forming fine patterns described with reference to FIGS. 1A-2F and/or at least one semiconductor device fabricated using at least one of the methods of fabricating semiconductor devices described with reference to FIGS. 3A-3M.

The memory module 1000 according to example embodiments the inventive concepts may be, for example, a single in-line memory module (SIMM) in which the plurality of semiconductor packages 1200 may be mounted only on one surface of the PCB 1100 and/or a dual in-line memory module (DIMM) in which the plurality of semiconductor packages 1200 may be arranged on both surfaces of the PCB 1100. The memory module 1000 according to example embodiments of the inventive concepts may be a fully buffered DIMM (FB-DIMM) with an advanced memory buffer (AMB) configured to transmit external signals to the plurality of semiconductor packages 1200.

Figure 5:
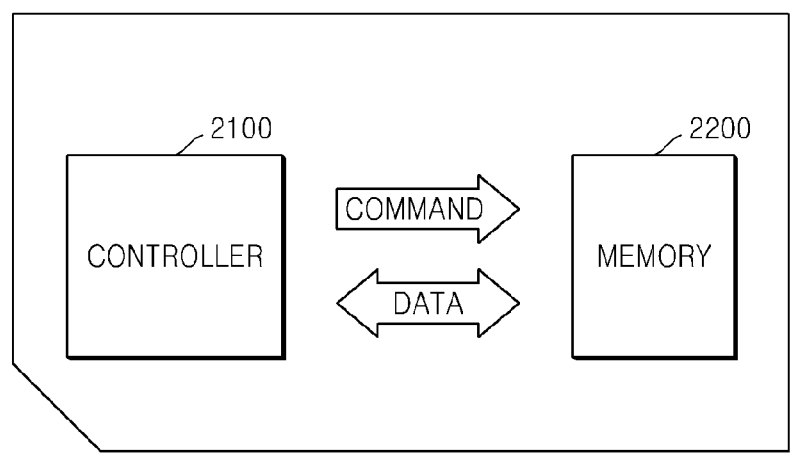

FIG. 5 is a block diagram illustrating memory cards including semiconductor devices fabricated according to example embodiments of the inventive concepts. Referring to FIG. 5, a memory card 2000 may include a controller 2100 and a memory 2200 that may exchange electric signals. For example, when the controller 2100 issues commands, the memory 2200 may transmit data. The memory 2200 may include one or more of the semiconductor devices fabricated according to example embodiments of the inventive concepts.

The memory 2200 may include at least one semiconductor device fabricated using at least a portion of the methods of forming fine patterns described with reference to FIGS. 1A-2F and/or at least one semiconductor device fabricated using at least one of the methods of fabricating semiconductor devices described with reference to FIGS. 3A-3M. The memory card 2000 may constitute one or more of various kinds of cards, for example, a memory stick card, a smart media (SM) card, a secure digital (SD) card, a mini-secure digital (mini-SD) card, and/or a multimedia card (MMC).

Figure 6:
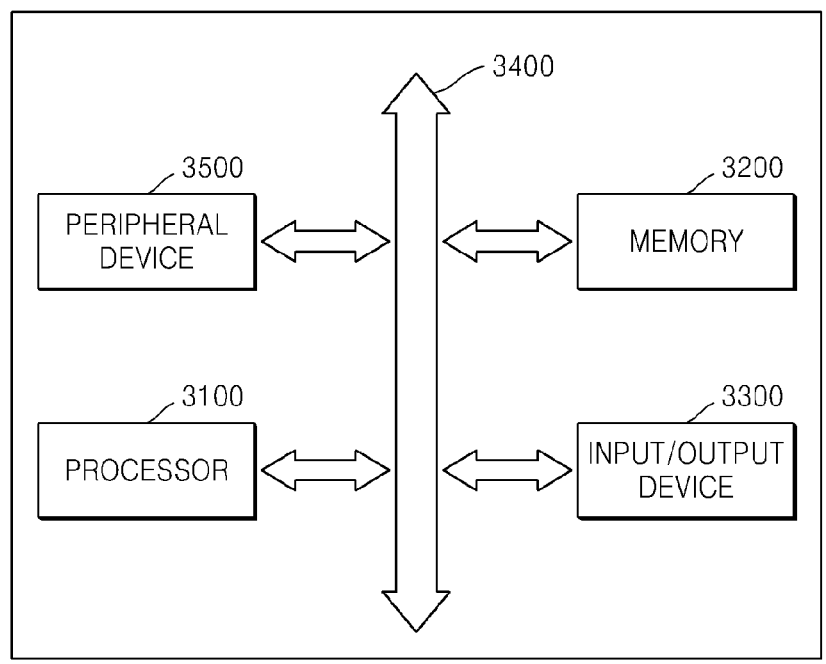

FIG. 6 is a block diagram illustrating systems including semiconductor devices fabricated according to example embodiments of the inventive concepts. Referring to FIG. 6, a system 3000 may include a processor 3100, a memory 3200, and/or an input/output (I/O) device 3300 that may transmit/receive data to and from one another through a bus 3400. The memory 3200 of the system 3000 may include a random access memory (RAM) and/or a read-only memory (ROM). A system 3000 may include a peripheral device 3500, for example, a floppy disk drive (FDD) and/or a compact-disk (CD) ROM drive.

The memory 3200 may include one of the semiconductor devices fabricated according to the example embodiments of the inventive concepts. The memory 3200 may include at least one semiconductor device fabricated using at least a portion of the methods of forming fine patterns described with reference to FIGS. 1A-2F and/or at least one semiconductor device fabricated using at least one of the methods of fabricating semiconductor devices described with reference to FIGS. 3A-3M. The memory 3200 may store codes and/or data that may be required for operations of the processor 3100. The system 3000 may be applied to, for example, mobile phones, MP3 players, navigation devices, portable multimedia players (PMPs), solid-state disks (SSDs) and/or household appliances.

While example embodiments have been particularly shown and described, it will be understood by one of ordinary skill in the art that variations in form and detail may be made therein without departing from the spirit and scope of the claims.

What is claimed is:

1. A method of forming a fine pattern, comprising:
   forming a first hard mask material layer on a substrate;
   forming a medium material layer to a thickness of less than or equal to about 20 nm on the first hard mask material layer;
   forming a photoresist (PR) pattern on the medium material layer;
   forming a medium pattern by removing a portion of the medium material layer using the PR pattern as a first mask;
   forming a first hard mask pattern by removing a portion of the first hard mask material layer using the medium pattern as a second mask; and
   removing a portion of the substrate.

2. The method of claim 1, wherein an aspect ratio of the PR pattern is less than or equal to about 3.

3. The method of claim 1, wherein a material of the first hard mask material layer includes polysilicon (poly-Si).

4. The method of claim 3, wherein a material of the medium material layer includes a silicon oxide.

5. The method of claim 1, wherein a material of the first hard mask material layer includes at least one of a metal, a metal silicide and a metal nitride.

6. The method of claim 5, wherein a material of the medium material layer includes at least one of a silicon oxide and a silicon oxynitride (SiON).

7. The method of claim 5, wherein a material of the first hard mask material layer includes one of tungsten (W), titanium (Ti), aluminum (Al), tungsten silicide (WSix), titanium nitride (TiN), tantalum nitride (TaN), tungsten nitride (WN), and a combination thereof.

8. The method of claim 1, further comprising:
   forming a second hard mask material layer with etch selectivity to the first hard mask material layer on the substrate; and
   forming a second hard mask pattern by removing a portion of the second hard mask material layer using the first hard mask pattern as a third mask,
   wherein the forming a first hard mask material layer on the substrate includes forming the first hard mask material layer on the second hard mask material layer, and
   the removing a portion of the substrate includes using the second hard mask pattern as a fourth mask.

9. The method of claim 1, wherein the forming a first hard mask pattern includes performing an anisotropic etch process under an absolute pressure of about 5 mTorr to about 50 mTorr using an etch gas including at least one of Cl2, HBr, SF6, NF3, BCl3, O2, and N2.

10. The method of claim 9, wherein the forming a first hard mask pattern includes performing the anisotropic etch process at a source power of about 10 W to about 1000 W and a bias power of less than or equal to about 500 W.

11. The method of claim 10, wherein during the forming a first hard mask pattern a ratio of an etch rate of the first hard mask material layer to an etch rate of the medium pattern is greater than about 20.

12. The method of claim 1, wherein
   a material of the first hard mask material layer includes poly-Si; and
   the forming a medium material layer includes thermally oxidizing a surface of the first hard mask material layer in an oxygen atmosphere such that the thickness of the medium material layer is less than or equal to about 20 nm.

13. The method of claim 1, wherein the forming a PR pattern includes forming a PR material layer on the medium material layer to a thickness of less than or equal to about 50 nm, and exposing and developing a PR material of the PR material layer.

14. A method of forming a fine pattern, comprising:
   forming a hard mask material layer on a substrate;
   forming a medium material layer on the hard mask material layer;
   forming a photoresist (PR) pattern with an aspect ratio of less than or equal to about 3 on the medium material layer;
   forming a medium pattern by patterning the medium material layer using the PR pattern as an etch mask;
   forming a hard mask pattern by etching the hard mask material layer using the medium pattern as an etch mask; and
   etching the substrate using the hard mask pattern as an etch mask,
   wherein a thickness of the medium material layer is determined such that an aspect ratio of the PR pattern remaining after the forming a medium pattern is greater than or equal to about 0.3.

15. The method of claim 14, wherein the forming a PR pattern includes forming the PR pattern to a thickness of less than or equal to about 35 nm.

16. A method of forming a fine pattern, comprising:
   forming a first layer on a substrate layer;
   forming a second layer on the first layer;
   forming a photoresist (PR) mask on the second layer;
   forming a second layer mask exposing the first layer by removing a material of the second layer through the PR mask;
   forming a first layer mask exposing the substrate layer by removing a material of the first layer through the second layer mask, a removal rate of the material of the first layer being greater than a removal rate of a material of the second layer mask; and forming a substrate layer pattern by removing a material of the substrate layer through the first layer mask.

17. The method of claim 16, wherein a thickness of the PR mask is less than a thickness of a PR mask required to form the substrate layer pattern without the second layer mask.

18. The method of claim 16, wherein an aspect ratio of the PR mask is less than or equal to about 2.

19. The method of claim 18, wherein a thickness of the second layer is less than or equal to about 20 nm.

20. The method of claim 19, further comprising:
forming a PR layer on the second layer, a thickness of the PR layer less than or equal to about 40 nm.

* * * * *